(12) United States Patent
Romas, Jr. et al.

(10) Patent No.: US 6,605,859 B1
(45) Date of Patent: Aug. 12, 2003

(54) BURIED ZENER DIODE STRUCTURE AND METHOD OF MANUFACTURE

(75) Inventors: Gregory G. Romas, Jr., McKinney, TX (US); Darrel C. Oglesby, Jr., Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/184,418

(22) Filed: Jun. 27, 2002

(51) Int. Cl.[7] ............................................. H01L 31/107
(52) U.S. Cl. ........................ 257/606; 257/199; 257/551; 257/603; 257/604
(58) Field of Search ................................. 257/551, 199, 257/606, 603, 604

(56) References Cited

U.S. PATENT DOCUMENTS

| | | | |
|---|---|---|---|
| 4,127,859 A | 11/1978 | Nelson | 357/13 |
| 4,136,349 A | 1/1979 | Tsang | 357/13 |
| 4,177,095 A | 12/1979 | Nelson | 148/175 |
| 4,601,760 A * | 7/1986 | Hemmah et al. | 438/527 |
| 4,646,114 A * | 2/1987 | Vinn et al. | 257/606 |
| 4,651,178 A * | 3/1987 | Avery | 257/551 |
| 4,652,895 A * | 3/1987 | Roskos | 257/551 |
| 4,683,483 A | 7/1987 | Burnham et al. | 357/13 |
| 4,742,021 A | 5/1988 | Burnham et al. | 437/149 |
| 4,833,509 A | 5/1989 | Hickox et al. | 357/13 |
| 5,027,165 A | 6/1991 | Doluca | 357/13 |
| 5,179,030 A | 1/1993 | Hemmah | 437/26 |
| 5,241,213 A * | 8/1993 | Hull | 257/606 |
| 5,869,882 A * | 2/1999 | Chen et al. | 257/605 |

* cited by examiner

*Primary Examiner*—Richard Elms
*Assistant Examiner*—Douglas Menz
(74) *Attorney, Agent, or Firm*—Jacqueline J. Garner; W. James Brady, III; Frederick J. Telecky, Jr.

(57) ABSTRACT

A buried Zener diode structure and method of manufacture requires no additional process steps beyond those required in a basic standard bipolar flow with up-down isolation. The buried Zener diode has its N++/P+ junction removed from the silicon surface.

2 Claims, 3 Drawing Sheets

BURIED ZENER DIODE STRUCTURE AND METHOD OF MANUFACTURE

BACKGROUND OF THE INVENTION

1. Field of the Invention

This invention relates generally to Zener diodes, and more particularly, to a buried Zener diode structure and method of manufacture that requires no additional process steps beyond those required in a basic standard bipolar flow with up-down isolation.

2. Description of the Prior Art

Conventional "surface" Zener reference diodes exhibit long-term drift due to impurities and other oxide charges that can build up over time. This phenomenon is known as "Zener walkout". Buried Zener diodes do not suffer these problems, since such diodes possess stable long-term performance. Buried Zener diodes generally require additional process steps beyond those typically used in a "Standard" bipolar flow. In view of the foregoing, it would be both advantageous and desirable to provide a buried Zener diode structure and method of manufacture that does not require additional process steps beyond those typically used in a "Standard" bipolar flow. Some buried Zener diode structures representative of the present state of the art are described in the U.S. patents discussed herein below.

U.S. Pat. No. 4,833,509, entitled Integrated Circuit Reference Diode And Fabrication Method Therefor, issued May 23, 1989, to Hickox et al., discloses an N+ buried layer, but that must be oversized to compensate for alignment after the EPI is grown. This structure also requires two N+ diffusions, thus requiring extra mask steps.

U.S. Pat. No. 5,027,165, entitled Buried Zener Diode, issued Jun. 25, 1991, to Doluca, discloses a buried Zener diode structure, but that undesirably requires an additional P+ diffusion.

U.S. Pat. No. 4,136,349, entitled IC Chip With Buried Zener Diode, issued Jan. 23, 1979, to Tsang, discloses a structure that requires both an oversized N+ layer as well as an extra P+ diffusion.

U.S. Pat. No. 4,683,483, entitled Subsurface Zener Diode And Method Of Making, issued Jul. 28, 1987, to Burnham et al., discloses a structure that requires the N+ layer to be oversized, requires and extra mask step, requires an emitter etch to clear the isolation oxide, and has additional alignment issues to deal with.

U.S. Pat. No. 4,742,021, entitled Subsurface Zener Diode And Method Of Making, issued May 3, 1988, to Burnham et al., discloses a structure that requires the N+ layer to be oversized, requires a Pwell diffusion, and also requires an additional step comprising etching the emitter mask through the isolation oxide.

U.S. Pat. No. 4,177,095, entitled Process For Fabricating An Integrated Circuit Subsurface Zener Diode Utilizing Conventional Processing Steps, issued Dec. 4, 1979, to Nelson, discloses a structure that requires an emitter diffusion through an isolation oxide (extra mask step), the N+ layer to be oversized, and a breakdown that is set by ISO/Emitter doping, that is generally not well controlled.

U.S. Pat. No. 4,127,859, entitled Integrated Circuit Subsurface Zener Diode, issued Nov. 28, 1978, to Nelson, discloses a structure that requires the N+ layer to be oversized.

U.S. Pat. No. 5,179,030, entitled Method Of Fabricating A Buried Zener Diode Simultaneously With Other Semiconductor Devices, issued Jan. 12, 1993, to Hemmah, discloses a structure in which the substrate is the anode and that does not have a buried junction.

SUMMARY OF THE INVENTION

The present invention is directed to a buried Zener diode structure and method of manufacture that requires no additional process steps beyond those required in a basic standard bipolar flow with up-down isolation.

In one aspect of the invention, a buried Zener diode is provided where the N++/P+ junction is removed from the silicon surface without requiring additional process steps beyond those typically used in a "Standard" bipolar flow.

In another aspect of the invention, a buried Zener diode is provided having more stable long-term performance than conventional "surface" Zener reference diodes without requiring additional process steps beyond those typically used in a "Standard" bipolar flow.

In yet another aspect of the invention, a buried Zener diode is provided having a P-type buried isolation (PBL) to make contact to the anode of the Zener diode.

BRIEF DESCRIPTION OF THE DRAWINGS

Other aspects, features and advantages of the present invention will be readily appreciated, as the invention becomes better understood by reference to the following detailed description when considered in connection with the accompanying drawing figures wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
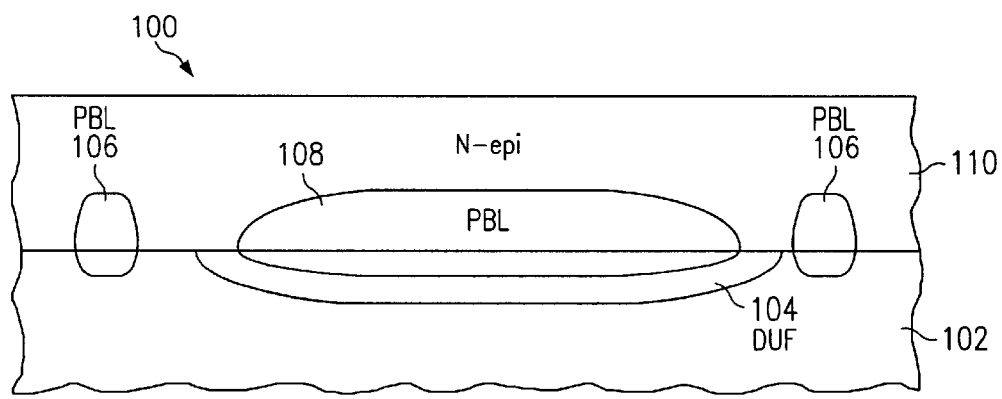
FIG. 1 is a pictorial diagram showing a P-type substrate, a N-type buried layer driven into the substrate, a P-type implant placed within the N-type buried layer, and a grown EPI region.

FIG. 1 illustrates one portion of a buried Zener diode structure 100, according to one embodiment that is manufactured by starting with a P-type substrate 102. First, an N-type buried layer 104 is deposited onto, and driven into, the substrate 102. This is the NPN buried collector (DUF). Second, a P-type implant/deposition 108 is placed within the DUF diffusion 104. This P-type diffusion 108 corresponds to the P-type buried isolation (PBL) used to define the transistor tanks. Then the EPI 110 is grown to provide the structure shown in FIG. 1.

Figure 2:
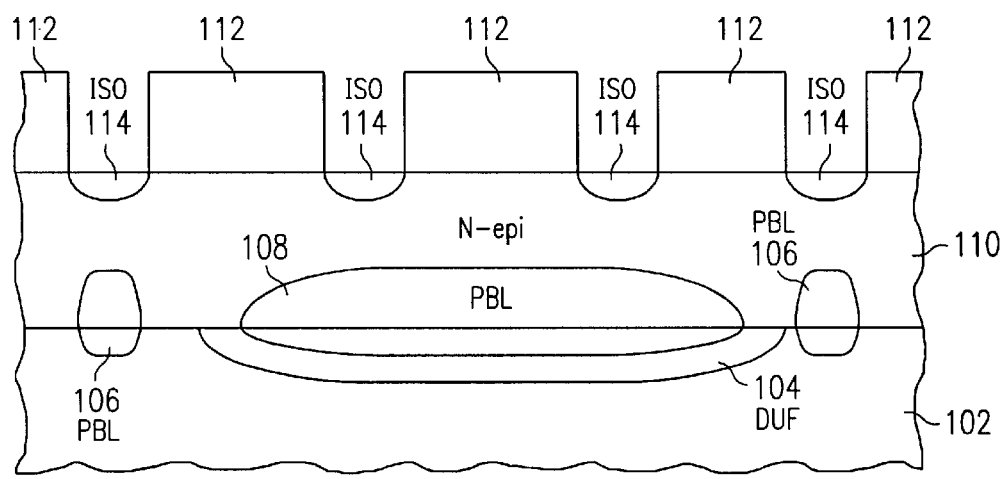
FIG. 2 is a pictorial diagram showing the structure depicted in FIG. 1 further having a field oxide region etched open and P+ deposition made in two places within the diode tank to provide a P+ diffusion corresponding to a top isolation region (ISO)

Subsequent to the steps described herein above, the field oxide 112 shown in FIG. 2 is then etched open, and a P+ deposition 114, also shown in FIG. 2, is made in two places within the diode tank. FIG. 2 is a pictorial diagram showing the structure 100 depicted in FIG. 1 further having a field oxide region 112 etched open and P+ deposition 114 made in two places within the diode tank to provide a P+ diffusion corresponding to a top isolation region (ISO).

Figure 3:
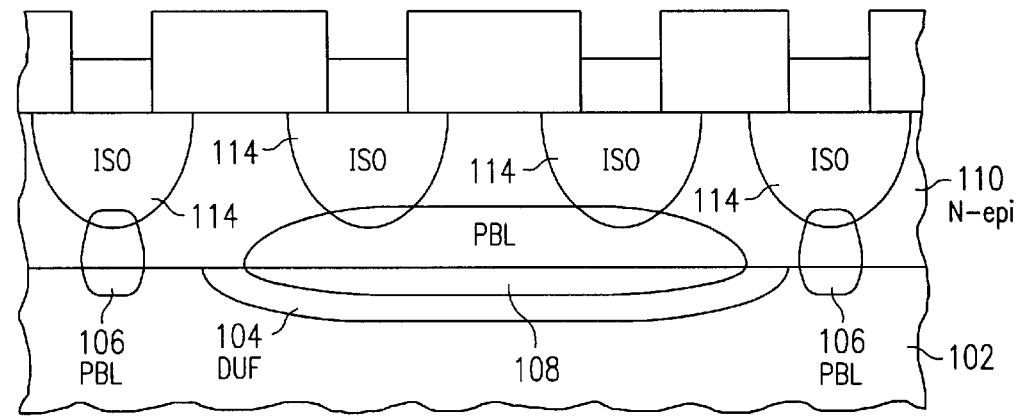
FIG. 3 is a pictorial diagram showing the structure depicted in FIG. 2 further having the upper ISO and lower PBL diffusion coming together to isolate the transistors and forming the connecting path to the anode of the buried Zener.

The P+ depositions 114 are next driven in such that the upper ISO and lower PBL diffusions come together and isolate the transistors such as illustrated in FIG. 3 that is a pictorial diagram showing the structure depicted in FIG. 2 further having the upper ISO and lower PBL diffusion coming together to isolate the transistors and forming the connecting path to the anode of the buried Zener diode.

Figure 4:
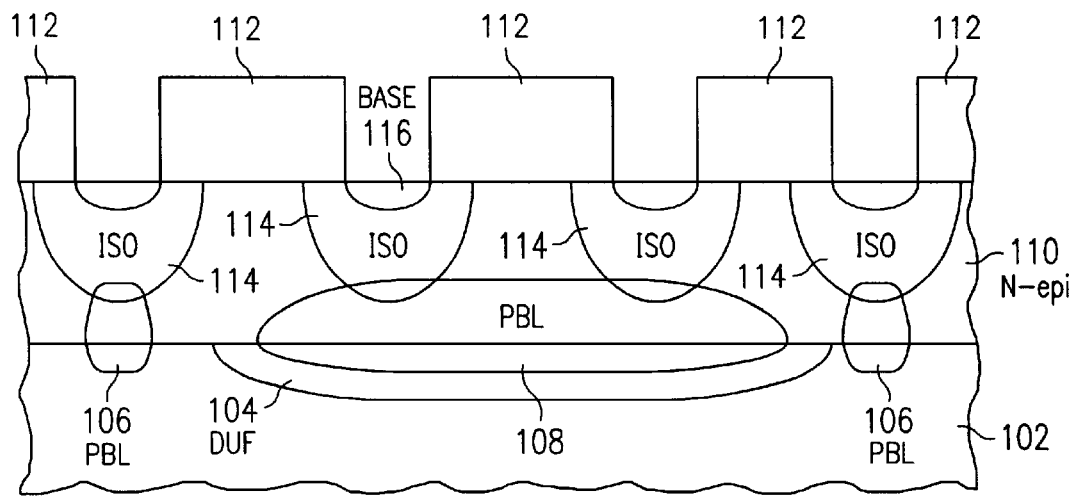
FIG. 4 is a pictorial diagram showing the structure depicted in FIG. 3 further having an NPN base implant/deposition placed into each of the ISO regions after removing the oxide from the region above the ISO regions.

During the mask step that defines the NPN transistor "Base", the oxide is also removed from the region above the isolation diffusions 114. FIG. 4 is a pictorial diagram showing the structure depicted in FIG. 3 further having an NPN base implant/deposition 116 that is driven into the silicon to place an NPN base dopant into each of the ISO regions 114 after removing the oxide 112 from the region above the ISO regions 114. Importantly, since the doping concentration of the NPN "Base" diffusion 116 is significantly higher than that of the associated ISO region 114, the Base region will control the breakdown voltage of any diode structure that uses it as part of its fabrication.

Figure 5:
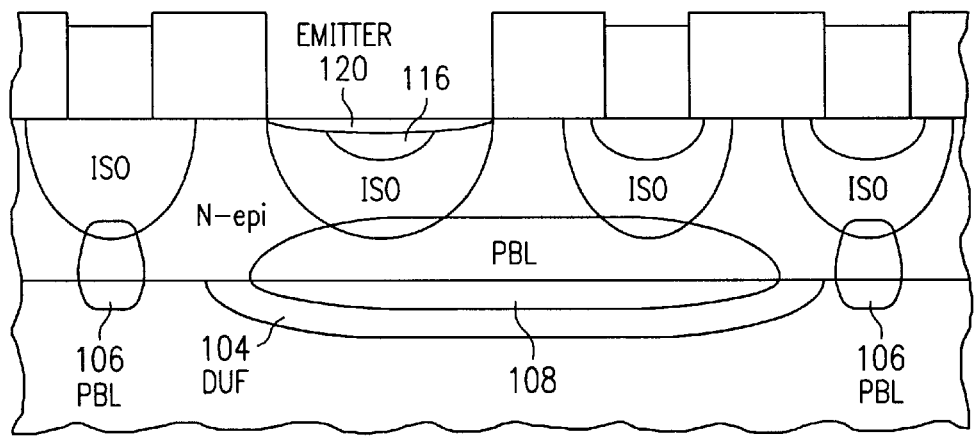
FIG. 5 is a pictorial diagram showing the structure depicted in FIG. 4 further having a doped N++ "Emitter" diffusion region driven into one of the base regions.

Subsequent to forming the Base regions, an NPN Emitter mask is used to reopen a desired Base region 116 that is then doped N++ to form the N-type cathode diffusion region 120 shown in FIG. 5. The N++ doped diffusion region 120 is most preferably slightly oversized beyond that of the isolation 114 as shown in FIG. 5 to account for the out-diffusion of the "Base" 116 and isolation 114 during its drive-in process to ensure that no surface breakdown can occur.

Figure 6:
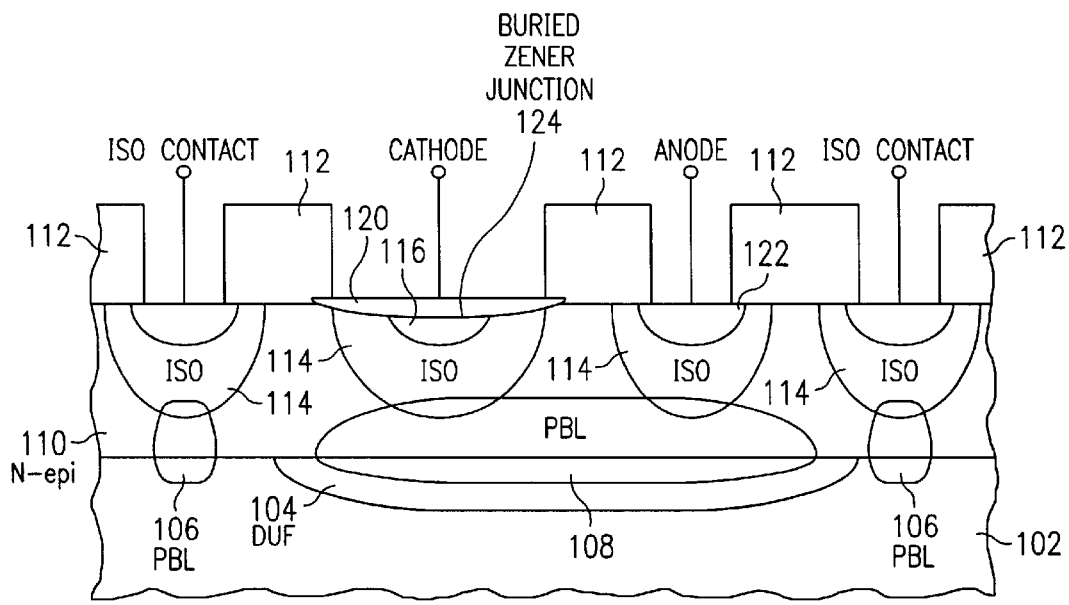
FIG. 6 is a pictorial diagram showing the structure depicted in FIG. 5 further having a contact etch applied to allow contact to the cathode and anode of the Zener diode.

The oxide 112 is then grown over the open silicon areas, and a contact etch is applied to allow contact to the Emitter (cathode) 120 and anode 122 of the buried Zener diode structure shown in FIG. 6. Standard integrated circuit manufacturing techniques are then used to complete interconnection and passivation of the buried Zener diode device. The heaviest N++/P+ junction 124 will be directly under the Emitter diffusion 120; and that is where the Zener action will occur.

Figure 7:
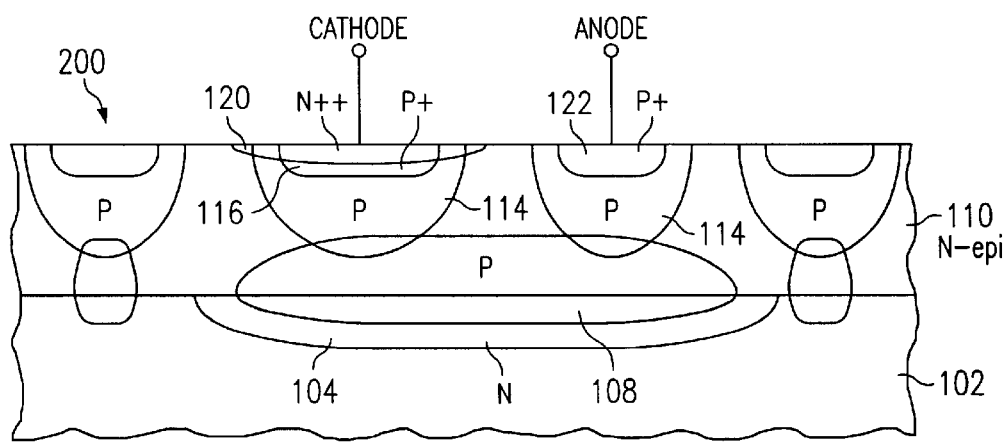
FIG. 7 is a pictorial diagram showing a complete buried Zener diode structure according to one embodiment of the present invention.

FIG. 7 is a pictorial diagram showing a complete buried Zener diode structure 200 manufactured according to the steps described herein above. In summary explanation, buried Zener diode 200 importantly requires no additional process steps to manufacture beyond those used in a "standard" bipolar process with an up-down isolation scheme. The P+ region 116 is formed by the NPN transistor "Base" diffusion; the N++ diffusion 120 is the NPN transistor "Emitter" diffusion. The use of the P-type buried layer 114 to form the buried anode of the transistor relaxes the alignment requirements of the ISO to DUF subsequent to EPI growth, and thus allows the size of the initial DUF diffusion 104 to be smaller, thereby minimizing the size of the overall buried Zener diode structure 200.

Other realizations of "buried" Zener transistor in bipolar process flows that are known in the prior art require additional process steps that may include additional implants/depositions, well diffusions, or oxide etches. In the case of implants/depositions, the process steps are time consuming and costly. "Well" diffusions require extra (long) furnace cycles, and an additional process to monitor. Oxide etches generally require an additional mask step that is costly.

A buried Zener diode manufactured according to the principles described herein before is particularly useful in space or radiation hardened devices as well as low noise references to which bipolar circuits are well suited. Other uses include subcircuits of many different types of devices such as start-up, over-voltage protection, and undervoltage lock-out (UVLO) circuitry, among others.

In view of the above, it can be seen the present invention presents a significant advancement in the art of buried Zener diodes. Further, this invention has been described in considerable detail in order to provide those skilled in the transistor manufacturing art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:
1. A buried Zener diode comprising:
 a P-type semiconductor substrate having an upper surface;
 an N-type buried layer deposited onto the upper surface of the P-type substrate and driven into the P-type substrate to form an NPN buried collector (DUF) having an exposed upper surface, and defining an exposed upper surface associated with the P-type substrate;
 a P-type implant/deposition (PBL) placed within the DUF and having an exposed upper surface, the PBL defining a diode tank, and further defining the exposed upper surface associated with the DUF;
 an epitaxial (EPI) layer having an upper surface, the EPI layer encasing the exposed upper surface of the P-type substrate, the exposed upper surface of the DUF, and the exposed upper surface of the PBL;
 a field oxide encasing the upper surface of the EPI layer and having two voids between the upper surface of the EPI layer and the diode tank defined by the PBL;
 a P+ deposition (ISO) within each void, and that is driven into the diode tank such that the ISO merges with the PBL;
 an NPN base implant/deposition within each void, and that is driven into the ISO to form a NPN transistor base, the NPN base implant/deposition having an exposed upper surface and a doping concentration significantly higher than that of the ISO;
 an N++ emitter diffusion within a predetermined NPN base implant/deposition and having an exposed upper surface within the associated void, the emitter diffusion extending laterally beyond the NPN transistor base and its associated underlying isolation; and a contact etch applied to the exposed upper surface of the NPN base implant/deposition and the exposed upper surface of the emitter diffusion, wherein the N++ emitter diffusion and the predetermined NPN base implant/deposition define a N++/P+ Zener diode junction that is removed from the exposed upper surface of the N++ emitter diffusion.

2. The buried Zener diode according to claim 1 further comprising:

an electrical interconnection to the upper surface of the emitter diffusion defining a cathode; and an electrical interconnection to the upper surface of the NPN base implant/deposition devoid of emitter diffusion defining an anode.

* * * * *